US012805405B2

(12) United States Patent
Pang et al.

(10) Patent No.: US 12,805,405 B2
(45) Date of Patent: Nov. 17, 2026

(54) COOLED SYSTEM-ON-WAFER WITH MEANS FOR REDUCING THE EFFECTS OF ELECTROSTATIC DISCHARGE AND/OR ELECTROMAGNETIC INTERFERENCE

(71) Applicant: Tesla, Inc., Austin, TX (US)

(72) Inventors: Mengzhi Pang, Cupertino, CA (US); Yang Sun, Sunnyvale, CA (US); Yong guo Li, Gilroy, CA (US); Jianjun Li, Irvine, CA (US); Rodrigo Rodriguez Navarrete, Fremont, CA (US); Vijaykumar Krithivasan, Mountain View, CA (US); Rishabh Bhandari, San Carlos, CA (US)

(73) Assignee: Tesla, Inc., Austin, TX (US)

( * ) Notice: Subject to any disclaimer, the term of this patent is extended or adjusted under 35 U.S.C. 154(b) by 425 days.

(21) Appl. No.: 18/549,307

(22) PCT Filed: Mar. 1, 2022

(86) PCT No.: PCT/US2022/018348
§ 371 (c)(1),
(2) Date: Sep. 6, 2023

(87) PCT Pub. No.: WO2022/192034
PCT Pub. Date: Sep. 15, 2022

(65) Prior Publication Data

US 2024/0145432 A1 May 2, 2024

Related U.S. Application Data

(60) Provisional application No. 63/158,201, filed on Mar. 8, 2021.

(51) Int. Cl.
*H10W 40/10* (2026.01)
*H10W 40/00* (2026.01)
(Continued)

(52) U.S. Cl.
CPC ......... *H10W 90/00* (2026.01); *H10W 40/226* (2026.01); *H10W 42/20* (2026.01);
(Continued)

(58) Field of Classification Search
CPC ..... H10W 40/00; H10W 40/10; H10W 40/80; H10W 40/242; H10W 40/226;
(Continued)

(56) References Cited

U.S. PATENT DOCUMENTS 10,978,373 B2 4/2021 Ku et al.
12,368,148 B2 * 7/2025 Chen .................. H10W 40/255
(Continued)

FOREIGN PATENT DOCUMENTS

EP 3 678 175 7/2020
TW 201946236 12/2019
(Continued)

OTHER PUBLICATIONS

Chun et al., Jun. 3, 2020, InFO-SoW (System-on-Wafer) for High Performance Computing, 2020 IEEE 70th Electronic Components and Technology Conference, Jun. 3, 2020, pp. 1-6.
(Continued)

*Primary Examiner* — Hai L Nguyen
(74) *Attorney, Agent, or Firm* — Knobbe, Martens, Olson & Bear, LLP

(57) ABSTRACT

The present disclosure relates to processing systems and more specifically to integrated circuit (IC) packages designed to reduce the effects of electrostatic discharge and/or electromagnetic interference during integrated circuit manufacture and/or use. The IC assembly may include a wafer positioned between a cooling system and thermal dissipation structure. The cooling system and thermal dissipation structure include electrically conductive material at a ground potential such that the thermal systems act as
(Continued)

electrical ground. The wafer may be electrically connected to the cooling system and thermal dissipation structure to reduce static charge accumulation during the assembly process. The cooling system and thermal dissipation structure may further provide radio frequency (RF) shielding to reduce electromagnetic interference during use of the IC assembly.

22 Claims, 7 Drawing Sheets

(51) Int. Cl.

| | |
|---|---|
| ***H10W 40/22*** | (2026.01) |
| ***H10W 42/20*** | (2026.01) |
| ***H10W 42/60*** | (2026.01) |
| ***H10W 90/00*** | (2026.01) |

(52) U.S. Cl.
CPC .......... *H10W 42/60* (2026.01); *H10W 90/721* (2026.01); *H10W 90/756* (2026.01)

(58) Field of Classification Search
CPC ...... H10W 90/00; H10W 90/726; H05K 9/00; H05K 9/006; H05K 9/0064
USPC .......................................................... 327/564
See application file for complete search history.

(56) References Cited

U.S. PATENT DOCUMENTS

| | | | | |
|---|---|---|---|---|
| 12,424,511 | B2 * | 9/2025 | Lee ..................... | H10W 40/255 |
| 2009/0040731 | A1 | 2/2009 | Jin et al. | |
| 2015/0245533 | A1 | 8/2015 | Wright et al. | |
| 2017/0084596 | A1 | 3/2017 | Scanlan | |
| 2017/0196075 | A1 | 7/2017 | Barron et al. | |
| 2019/0304959 | A1 | 10/2019 | Yu et al. | |
| 2020/0212018 | A1 | 7/2020 | Lai et al. | |
| 2020/0395257 | A1 | 12/2020 | Chun et al. | |

FOREIGN PATENT DOCUMENTS

| | | |
|---|---|---|
| TW | 202002031 | 1/2020 |
| TW | 202105663 | 2/2021 |
| TW | 202107632 | 2/2021 |

OTHER PUBLICATIONS

International Search Report and Written Opinion dated Jul. 6, 2022 in application No. PCT/US2022/018348.

* cited by examiner

COOLED SYSTEM-ON-WAFER WITH MEANS FOR REDUCING THE EFFECTS OF ELECTROSTATIC DISCHARGE AND/OR ELECTROMAGNETIC INTERFERENCE

CROSS-REFERENCE TO RELATED APPLICATION

This application is a U.S. national phase application under 35 U.S.C. § 371 of International Application No. PCT/US2022/018348, titled "COOLED SYSTEM-ON-WAFER WITH MEANS FOR REDUCING THE EFFECTS OF ELECTROSTATIC DISCHARGE AND/OR ELECTROMAGNETIC INTERFERENCE," filed on Mar. 1, 2022, which claims the benefit of U.S. Provisional Patent Application No. 63/158,201, titled "SYSTEM FOR REDUCED EFFECTS OF ELECTROSTATIC DISCHARGE AND/OR ELECTROMAGNETIC INTERFERENCE," filed Mar. 8, 2021, the disclosures of each of which are incorporated herein by reference in its entirety their entireties and for all purposes.

TECHNICAL FIELD

The present disclosure relates to processing systems and more specifically to integrated circuit (IC) packages that can reduce the effects of electrostatic discharge and/or electromagnetic interference.

BACKGROUND

Recent increases in market demand for artificial intelligence and high-powered computing have pushed integrated circuit (IC) design toward the use of larger IC package sizes. During assembly of large IC packages, the IC packages may experience electrostatic discharge (ESD) events. Large IC packages may also experience electromagnetic interference (EMI) during use. EMI may generally degrade performance of ICs.

SUMMARY

The innovations described in the claims each have several aspects, no single one of which is solely responsible for its desirable attributes. Without limiting the scope of the claims, some prominent features of this disclosure will now be briefly described.

In some implementations, an integrated circuit (IC) package is provided for reducing possible damage and unintended effects related to electrostatic discharge (ESD) and/or electromagnetic interference (EMI). An IC assembly may include a system on a wafer (SoW) positioned between a cooling system and thermal dissipation structure. A thermal system may include the cooling system and the thermal dissipation structure. The SoW may contain a plurality of IC dies connected into an integrated system via components, such as printed circuit boards, for data transfer. The thermal system may include an electrically conductive structure configured at a ground potential such that the thermal system may serve as electrical ground. The SoW may be electrically connected to the conductive structure, thereby reducing and/or eliminating static charge accumulation during the assembly process. Conductive features extending between the SoW and the conductive structure of the thermal system may provide radio frequency (RF) shielding during use of the IC assembly.

One aspect of this disclosure is a system on a wafer (SoW) assembly that includes a SoW, a thermal system, and a plurality of conductive features. The SoW includes a plurality of integrated circuit (IC) dies and one or more routing layers providing electrical connections for the IC dies. The thermal system includes a conductive structure at a ground potential. The thermal system is configured to cool the SoW. The plurality of conductive features are in electrical paths between contacts on a surface of the SoW and the conductive structure of the thermal system.

The plurality of conductive features can ground the SoW to the conductive structure of the thermal system to provide electrostatic discharge protection. The plurality of conductive features can ground the SoW to the conductive structure of the thermal system to provide electromagnetic interference shielding. The plurality of conductive features can be positioned around a periphery of the SoW. The plurality of conductive features can a conductive foam. Alternatively, the plurality of conductive features can include a wire bond or a spring loaded clip.

The SoW can be an Integrated Fan-Out wafer. The SoW can have a diameter of at least 12 inches. The SoW assembly can include voltage regulating modules positioned between the IC dies and the conductive structure of the thermal system.

The thermal system can include a thermal dissipation structure on an opposing side of the SoW relative to the conductive structure. There can be an electrical connection between the thermal dissipation structure and the conductive structure.

The SoW assembly can include a plurality of components in electrical paths between the contacts on the surface of the SoW and the plurality of conductive features. The plurality of components can each have exposed conductive material in electrical paths with the conductive features.

Another aspect of this disclosure is a SoW assembly that includes a SoW, a thermal system, a plurality of components, and a plurality of conductive features. The SoW includes a plurality of IC dies and one or more routing layers providing electrical connections for the IC dies. The thermal system includes a conductive structure at a ground potential. The thermal system is configured to cool the SoW. The plurality of components are positioned between the SoW and the conductive structure of the thermal system. The components each have exposed conductive material on a surface opposite the SoW. The plurality of components are electrically connected to the SoW by way of contacts on a surface of the SoW, The plurality of conductive features are in electrical paths between the exposed conductive material of the plurality of components and the conductive structure of the thermal system.

The plurality of components can include a printed circuit board. The SoW assembly can include an electrostatic discharge protection circuit on the printed circuit board. The plurality of components can be positioned around the plurality of IC dies.

The plurality of conductive features contribute to electrostatic discharge protection and/or provide electromagnetic interference shielding. The plurality of conductive features can include a conductive foam.

Another aspect of this disclosure is a method of manufacturing a SoW assembly. The method includes providing a SoW with contacts on a surface of the SoW, wherein the SoW comprises a plurality of IC dies and one or more routing layers providing electrical connections for the IC dies, and wherein the contacts are electrically connected to the IC dies via the one or more routing layers, and electrically connecting a conductive structure of a thermal system to the contacts on the surface of the SoW by way of at least a plurality of conductive features, wherein the conductive structure of the thermal system is at a ground potential.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

Figure 1:
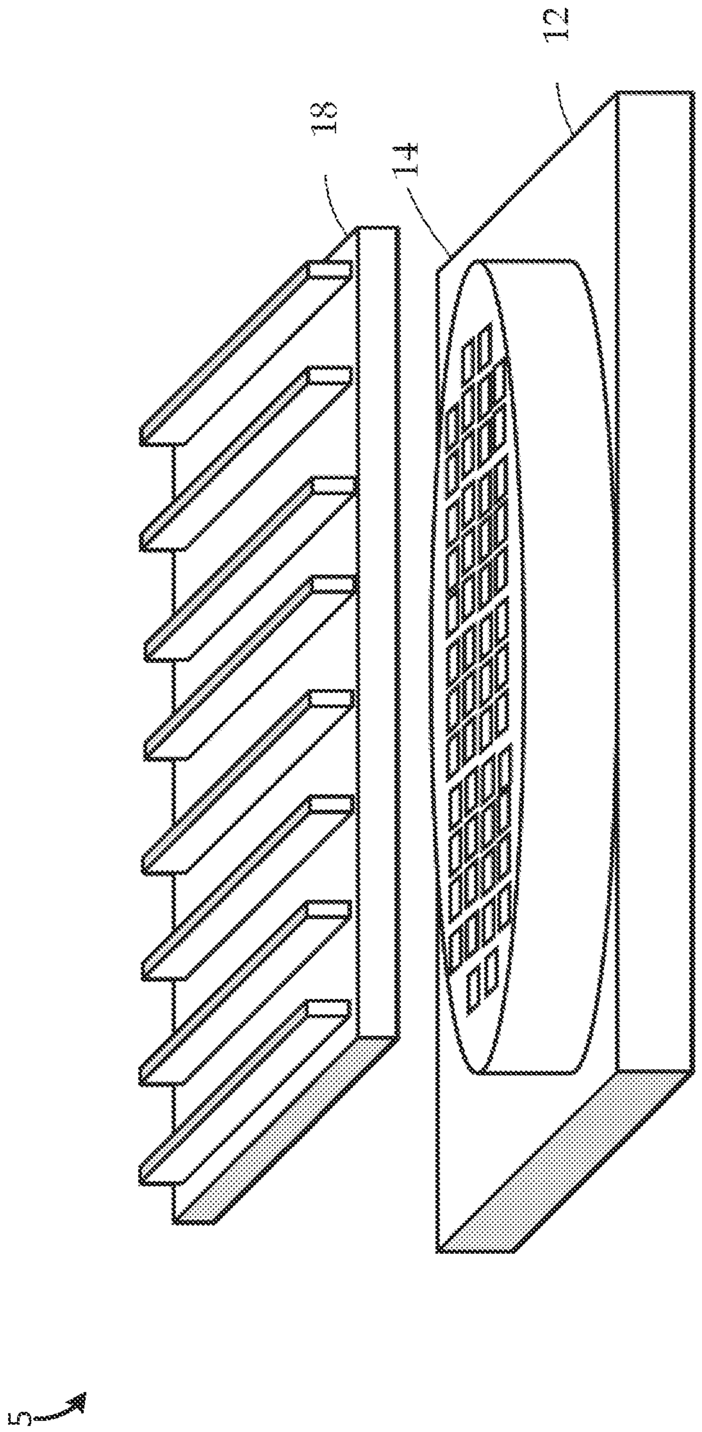
FIG. 1 shows an example processing system.

Throughout the drawings, reference numbers may be re-used to indicate correspondence between referenced elements. The drawings are provided to illustrate example embodiments described herein and are not intended to limit the scope of the disclosure.

DETAILED DESCRIPTION OF CERTAIN EMBODIMENTS

The following description of certain embodiments presents various descriptions of specific embodiments. However, the innovations described herein may be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments may include more elements than illustrated in a drawing and/or a subset of the elements illustrated in a drawing. Further, some embodiments may incorporate any suitable combination of features from two or more drawings.

As discussed above, recent increases in market demand for high-powered computing have pushed integrated circuit (IC) design toward the use of larger IC package sizes. During assembly of large IC packages, electric static charge may accumulate on assembly machinery and/or bodies of manufacturing plant technicians. Under such charged conditions, close proximity interaction or direct contact with the IC package may cause a static charge transfer to the IC package through an event known as an electrostatic discharge (ESD) event. The IC chips included within the IC package may be damaged by the ESD event. Without ESD protection, the IC assembly yield may be reduced due to ESD damage. In addition, during use of the assembled IC package, electromagnetic interference (EMI) may disrupt proper functioning of the IC. Without EMI protection, performance of IC assemblies may be degraded due to EMI. Thus, there is a need for IC package design that incorporates ESD protection and/or EMI protection.

Typically, integrated circuit (IC) packages have a fairly small form factor. In such IC packages, there may be limited physical space for ESD protection devices and/or EMI protection structures. Manufacturing machinery that contacts the IC package can be arranged to meet strict ESD specifications for such IC packages. The IC package is assembled by the manufacturing machinery, so manufacturing plant workers do not need to touch IC package components in certain instances. Although some ESD/EMI protection features are included inside individual chips during the wafer manufacturing process, ESD/EMI protection features are not typically built at a system level for a system on a wafer. Only after IC packages are mounted on printed circuit board (PCB) mother boards do they typically have system-level protection by ESD and/or EMI protection features and components on the PCB mother board.

For large form factor IC packages, however, the assembly and system installation processes may involve manual handling. Manual handling risks ESD damage to the IC package because electric static charge may accumulate on the human body, and close proximity interaction and/or direct contact with the IC package may cause a discharge to the IC package. Due to the sensitive nature of IC components and design, a relatively small static electricity discharge may damage an entire component. Further, large form factor IC packages may not be mounted on PCB mother boards and, in such cases, cannot utilize ESD and/or EMI protection features from a PCB mother board.

Advantageously, in some implementations, a processing system with integrated ESD protection may reduce risk of ESD damage from manual handling. The processing system may be a system on a wafer (SoW) assembly where the SoW is positioned between two parts of a thermal system. In such an assembly, thermal interface material positioned between the SoW to the thermal system may include a high thermal conductivity material. In cases where the thermal interface material has a relatively poor electrical conductivity material, there may be an accumulation of static charge during manufacturing. The processing system of embodiments disclosed herein grounds the SoW to protect the IC devices of the SoW from ESD damage. The thermal system of the processing system may include electrically conductive material at a ground potential such that the thermal system functions as electrical ground. The SoW may be electrically connected to the thermal system. Accumulated charge on the SoW may thus discharge out of the system. The processing system may therefore reduce ESD damage risk during manual handling.

The processing system may also allow for greater flexibility in selection of manufacturing machinery. In contrast, smaller form factor IC package assembly may involve strict ESD standards applied to the manufacturing machinery where the IC package does not typically have system-level ESD protective features. Moreover, individual IC dies can have internal ESD protection that may not provide sufficient ESD protection for system-level package assembly for SoWs. Because the processing system of embodiments disclosed herein may have integrated ESD protection, a wider range of machinery may be used during system assembly. The presence of ESD protection in the processing system may also allow for more diverse uses of the processing system. Because the processing system may not need to utilize a connection to a mother board for ESD protection, the processing system may be arranged in configurations that were previously impractical.

Advantageously, the processing system of embodiments disclosed herein may reduce risk of unreliable functioning and/or hardware damage caused by EMI during operation of the processing system. EMI effects may be reduced with radio frequency (RF) shielding. The two parts of the thermal system of the processing system may be secured to each other via a conductive frame. The conductive thermal systems and the conductive frame may form a shielding cage to reduce EMI effects. Thus, the processing system may reduce risk of damage due to one or more ESD events and undesired effects of EMI.

The IC package design may be utilized to improve any suitable large IC packaging system that may benefit from ESD protection and/or EMI shielding, such as a system with multiple silicon chips directly assembled on a build-up substrate. Although embodiments disclosed herein may be described with reference to ESD protection, any suitable principles and advantages disclosed herein may be applied to provide electrical overstress protection. Electrical overstress protection encompasses ESD protection, overvoltage protection, and the like.

Example Processing System Configurations

Reference will now be made to the drawings, in which like reference numerals refer to like parts throughout. Unless indicated otherwise, the drawings are schematic and not necessarily drawn to scale.

FIG. 1 illustrates a processing system 5 in accordance with aspects of this disclosure. Features of this disclosure may be implemented in the processing system 5 and/or any other suitable processing system (e.g., the processing system 10). The processing system 5 may have a high compute density and may dissipate heat generated by the processing system 5. The processing system 5 may execute trillions of operations per second in certain applications. The processing system 5 may be used in and/or specifically configured for high performance computing and/or computation intensive applications, such as neural network training and/or processing, machine learning, artificial intelligence, or the like. The processing system 5 may implement redundancy. In some applications, the processing system 5 may be used for neural network training to generate data for use by an autopilot system for a vehicle (e.g., an automobile).

As illustrated, the processing system 5 includes a thermal dissipation structure 12, a system on a wafer (SoW) 14, and a cooling system 18. The thermal dissipation structure 12 and the cooling system 18 as positioned on opposing sides of the SoW 14 as illustrated. A thermal system of the processing system includes the thermal dissipation structure 12 and the cooling system 18. The processing system 5 is illustrated with a surface of the SoW 14 separated from the cooling system 18 to show features of the SoW 14. After assembly, the SoW 14 may be attached to the cooling system 18 directly or by way of one or more intervening structures. The processing system 5 is a SoW assembly.

The thermal dissipation structure 12 may dissipate heat from the SoW 14. The thermal dissipation structure 12 may include a heat spreader. Such a heat spreader may include a metal plate. Alternatively or additionally, the thermal dissipation structure may include a heat sink. The thermal dissipation structure 12 may include metal, such as copper and/or aluminum. The thermal dissipation structure 12 may alternatively or additionally include any other suitable material with desirable heat dissipation properties. In certain applications, the thermal dissipation structure 12 may include a copper heat spreader and an aluminum heat sink. A thermal interface material may be included between the thermal dissipation structure 12 and the SoW 14 to reduce and/or minimize heat transfer resistance.

The SoW 14 may include an array of integrated circuit (IC) dies. The IC dies may be embedded in a molding material. The SoW 14 may have a high compute density. The IC dies may be semiconductor dies, such as silicon dies. The array of IC dies may include any suitable number of IC dies. For example, the array of IC may include 16 IC dies, 25 IC dies, 36 IC dies, or 49 IC dies. The SoW 14 may be an Integrated Fan-Out (InFO) wafer, for example. InFO wafers may include a plurality of routing layers over an array of IC dies. For example, an InFO wafer may include 4, 5, 6, 8, or 10 routing layers in certain applications. The routing layers of the InFO wafer may provide signal connectivity between the ICs dies and/or to external components. The SoW 14 may have a relatively large diameter, such as a diameter in a range from 10 inches to 15 inches. As one example, the SoW 14 may have a 12 inch diameter. The SoW 14 can have a diameter of at least 12 inches.

The cooling system 18 may provide active cooling for the processing system 5. The cooling system 18 may include metal with flow paths for heat transfer fluid to flow through. As one example, the cooling system 18 may include machined metal, such as copper. The cooling system 18 may include brazed fin arrays for high cooling efficiency. The cooling system 18 can include a conductive structure at a ground potential. The conductive structure can be a ground plane, a conductive layer, or any other suitable conductive structure at a ground potential. In the assembled processing system 5, the cooling system 18 may be bolted or otherwise fastened to the heat dissipation structure 12. This may provide structural support for the SoW 14 and/or may reduce the chance of the SoW 14 breaking. The bolt or another fastener may be metallic and electrically connect conductive structures of the cooling system 18 and the heat dissipation structure 12.

Example Wafer Configurations

Figure 2:
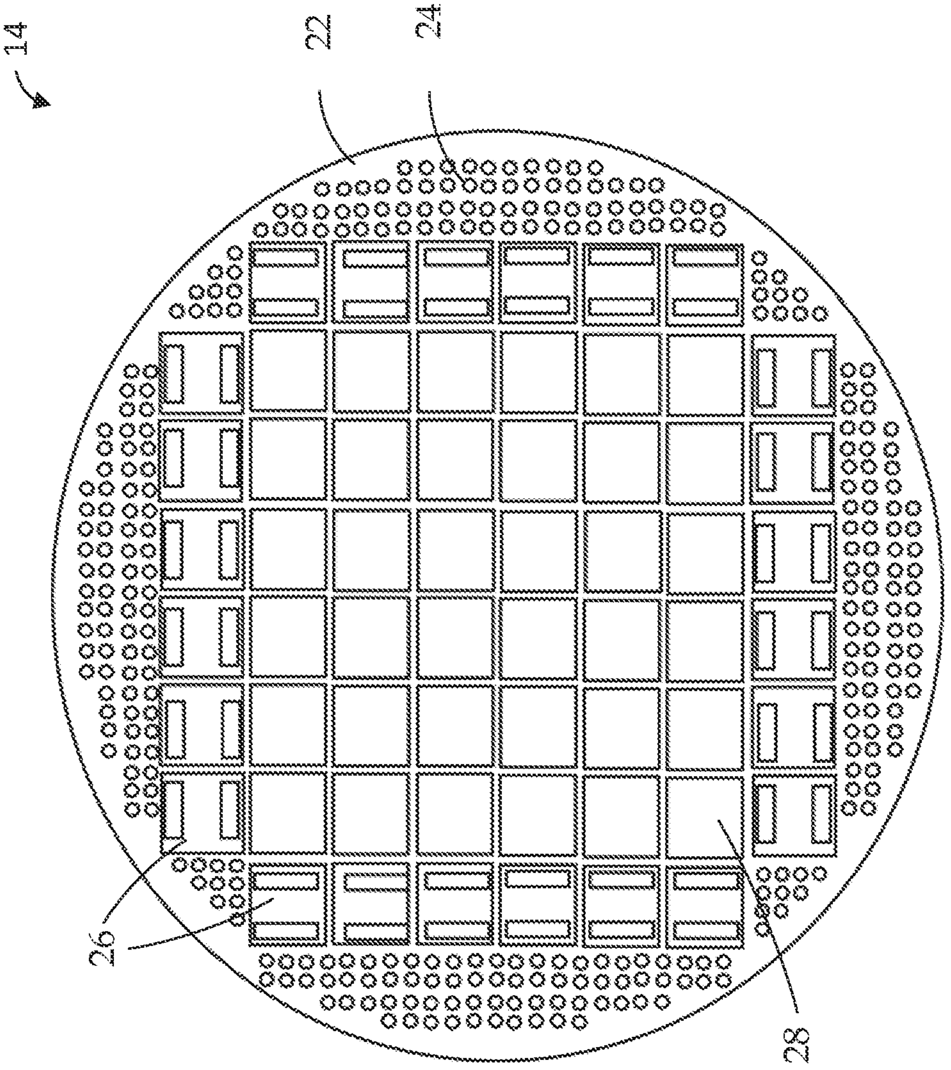
FIG. 2 is a plan view of a system on a wafer used in a processing system.

FIG. 2 is a plan view of the SoW 14. The SoW 14 includes a wafer 22. The wafer 22 may be a silicon wafer. The illustrated SoW 14 includes an array of IC dies 28. In some implementations, the IC dies 28 may be embedded in the SoW 14 and therefore not visible while viewing the SoW 14 from the top view. For example, molding material may cover the ICs dies 28. The SoW 14 may also include one or more routing layers 31 (see FIG. 3). The IC dies 28 may be semiconductor dies, such as, but not limited to, silicon dies. The array of IC dies 28 may include any suitable number of IC dies.

The IC dies 28 may be connected to components 26 for data transfer. For example, the components 26 may be PCBs. The components 26 may alternatively or additionally be any other suitable components that include circuit elements and/or routing. The components 26 may be arranged in a perimeter around the array of IC dies 28. As illustrated, the components 26 are positioned around a periphery of the array of IC dies 28. The components 26 may be electrically connected to the IC dies 28 from over a surface of the wafer 22 (for example, via soldering). Sections of a soldering mask may be stripped such that the metallic connections underneath are exposed. An exposed metal connection area 42 (see FIG. 4) of a component 26 may be electrically connected to the cooling system 18 such that the component 26 is electrically connected with the cooling system 18.

The surface of the wafer 22 may further contain a plurality of electrical contacts 24. In some implementations, the electrical contacts 24 may be under bump metallization (UBM) pads. The illustrated electrical contacts 24 are UBM pads. The electrical contacts 24 may be made of conductive material, such as, but not limited to, copper. The electrical contacts 24 may be copper pillars in certain applications, such as applications with UBM pads that are copper pillars. A higher density of electrical contacts 24 may be desirable to provide EMI protection for the SoW 14. The electrical contacts 24 may be placed 100 microns, 300 microns, 800 microns, or 900 microns apart, depending on manufacturing limitations and/or available space on the wafer 22. In some implementations, the electrical contacts 24 may only be open-air UBM pads which occupy any area of the wafer 22 that is not utilized by the IC dies 28 or components 26. Open-air UBM pads may not be connected to external components and therefore may have direct contact with open air. In some other implementations, the electrical contacts 24 may also occupy areas under the components 26, and these components may be soldered onto the electrical contacts 24 rather than directly mounted onto the wafer surface. In such implementations, only a portion of the electrical contacts 24 may be open-air UBM pads. In some implementations, the electrical contacts 24 may form a perimeter around the components 26. The electrical contacts 24 may be in the shape of a pillar or a hemisphere. As described herein, the electrical contacts 24 may be electrically connected to the cooling system 18 (see FIGS. 5A-C).

Example ESD/EMI Protection Configurations

Figure 3:
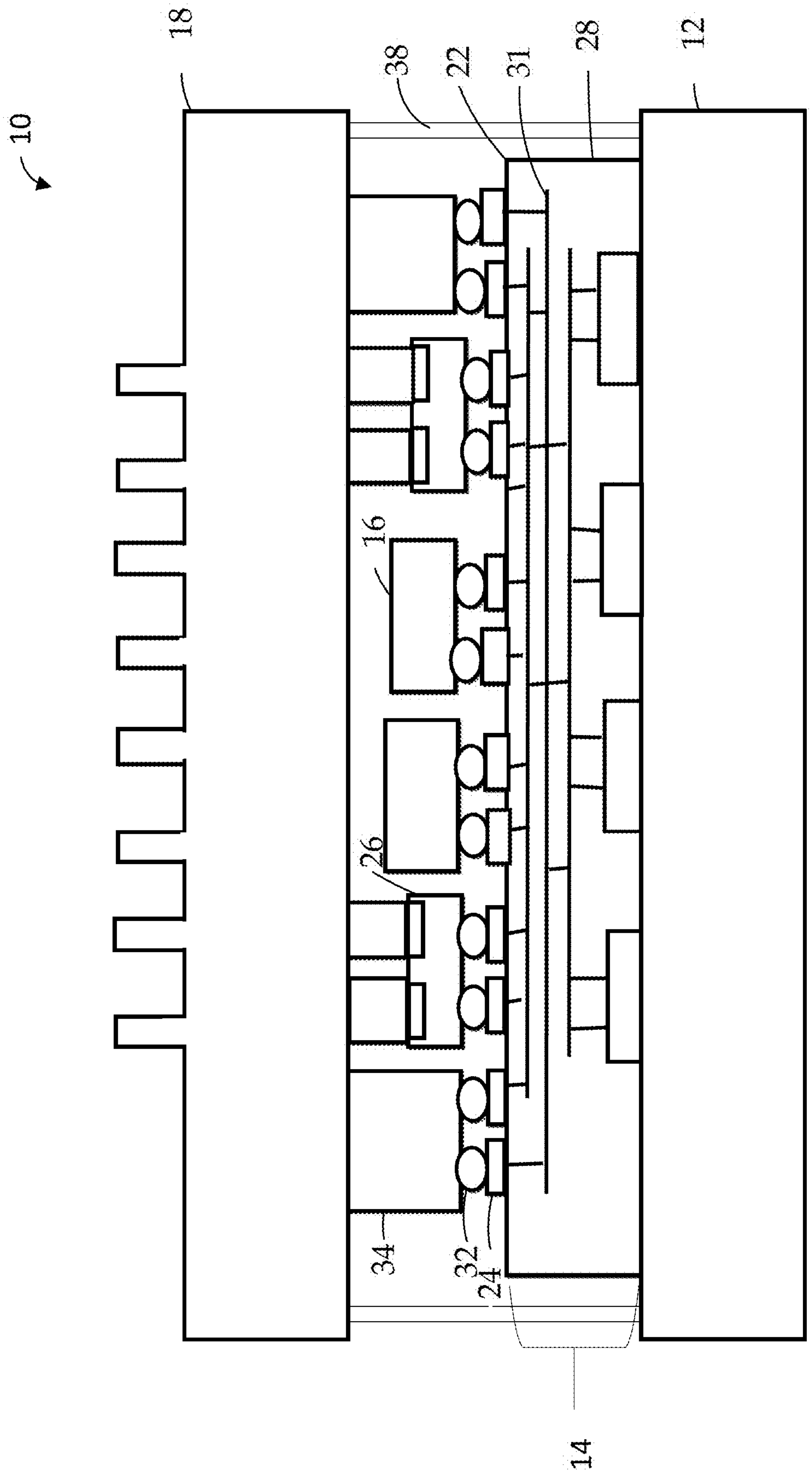
FIG. 3 illustrates a cross sectional view of an example processing system.

FIG. 3 shows a cross section of an assembled processing system 10, in accordance with aspects of this disclosure. This assembled processing system 10 is a SoW assembly. The processing system 10 may include a thermal dissipation structure 12, a SoW 14, voltage regulating modules (VRMs) 16, and a cooling system 18. The thermal dissipation structure 12 and/or the SoW 14 may include any suitable features discussed with reference to FIG. 1. In certain applications, the VRMs 16 may be positioned such that each VRM is stacked with an IC die 28 of the SoW 14. In the processing system 10, there may be a high density packing of the VRMs 16. Accordingly, the VRMs 16 may consume significant power. The VRMs 16 may be configured to receive a direct current (DC) supply voltage and supply a lower output voltage to a corresponding IC die of the SoW 14. The VRMs 16 can each provide a regulated voltage to a respective IC die 28. The cooling system 18 may provide active cooling for the VRMs 16. The cooling system 18 may include any suitable features discussed with reference to FIG. 1.

As illustrated in FIG. 3, the SoW 14 and VRMs 16 are positioned between the cooling system 18 and thermal dissipation structure 12. The SoW 14 may be bonded to the thermal dissipation structure 12 using an electrically conductive thermal interface material. The cooling system 18 may also be coated with the thermal interface material to secure conductive features to the cooling system 18 as described herein. In some embodiments, the thermal interface material used on the thermal dissipation structure 12 may be different from the thermal interface material used on the cooling system 18. The cooling system 18 and thermal dissipation structure 12 may be made of materials that have both high thermal conductivity and high electrical conductivity.

A thermal system of the processing system 10 includes the cooling system 18 and the thermal dissipation structure 12. Because the thermal system may include relatively large bodies of electrically conductive material, the thermal system may be at a ground potential and serve as electrical ground. A conductive layer formed by the thermal interface material may therefore also be at a ground potential. The cooling system 18 and thermal dissipation structure 12 may be connected via a conductive frame 38. The conductive frame 38 may be any securing mechanism made of conductive materials, such as, but not limited to, one or more of screws, bolts, nails, or metal clamps. The structure created by the cooling system 18, conductive frame 38, and thermal dissipation structure 12 may function as part of a Faraday cage to reduce EMI associated with the processing system 10. The Faraday cage may protect the internal circuit elements of the processing system 10 from EMI generated by external circuit elements. The Faraday cage may reduce EMI emitted by the processing system 10 to external circuit elements. The SoW 14 may be electrically connected to the thermal system such that the IC dies 28 are grounded, thereby reducing risk of damage from ESD events.

As described herein, the IC dies 28 and one or more routing layers 31 may be embedded in the SoW 14. In some implementations, the IC dies 28 may be electrically connected to the thermal dissipation structure 12 through direct contact with the thermal dissipation structure 12. In some other implementations, the IC dies 28 may be electrically connected to the thermal dissipation structure 12 through the routing layers 31. The routing layers 31 may also electrically connect the IC dies 28 with components of the processing system 10. The IC dies 28 may be electrically connected to VRMs 16 and components 26 by way of routing layers 31 and electrical contacts 24.

In some implementations, the electrical contacts 24 may only be open-air UBM pads and occupy areas of the wafer 22 that are not utilized by the IC dies 28 or connectors 26. In such embodiments, external components may be manufactured directly onto the SoW 14 without soldering. In some other implementations, and as illustrated in FIG. 3, the electrical contacts 24 may also occupy areas utilized by the IC dies 28 or components 26, and external components may be attached to the electrical contacts 24 via solder 32. In such implementations, only the outermost UBM pads are open-air UBM pads.

The IC dies 28 may be electrically connected with the cooling system 18 through one or more other components. Sections of a soldering mask of a component 26 may be stripped such that the metal underneath is exposed. The exposed metal connection areas 42 (see FIG. 4) may be covered by a first conductive feature 36 such that the exposed metal connection area 42 is electrically connected to the cooling system 18. The first conductive feature 36 can be a conductive ESD foam, for example. The open-air UBM pads may be electrically connected to the cooling system 18 via a second conductive feature 34. The component 26 and the second conductive feature 34 may both in turn be electrically connected to the IC dies 28 via the routing layers 31. The IC dies 28 may thus be electrically connected to the cooling system 18 and thermal dissipation structure 12 (both acting as electrical ground) through the other components. Static charge may therefore be discharged to the thermal system to reduce risk of hardware damage due to an ESD event. Moreover, as with the structure created by the thermal system and the conductive frame 38, the first conductive feature 36 and the second conductive feature 34 may create a structure with the thermal system that acts as a Faraday cage, thereby providing EMI shielding. In certain applications, the first conductive feature 36 and the second conductive feature 34 are formed of the same material. Alternatively, the first conductive feature 36 and the second conductive feature 34 can include different materials.

The VRMs 16 may be connected to the surface of the SoW 14 such that the VRMs 16 are electrically connected to the routing layers 31 and IC dies 28. The VRMs 16 may be aligned with the IC dies 28 such that each IC die 28 is located directly below a respective VRM 16. In some implementations, the VRMs 16 are not connected to the cooling system 18. In such implementations, static charge may build up in the SoW 14. Advantageously, the static charge may be discharged from the system through the routing layers 31, connectors 26, and open-air UBM pads.

In certain embodiments, a conductive structure of a thermal system may be at a ground potential and electrically connected to a metal connection of a component positioned over a SoW by way of a conductive feature. An example is illustrated in FIG. 4.

Figure 4:
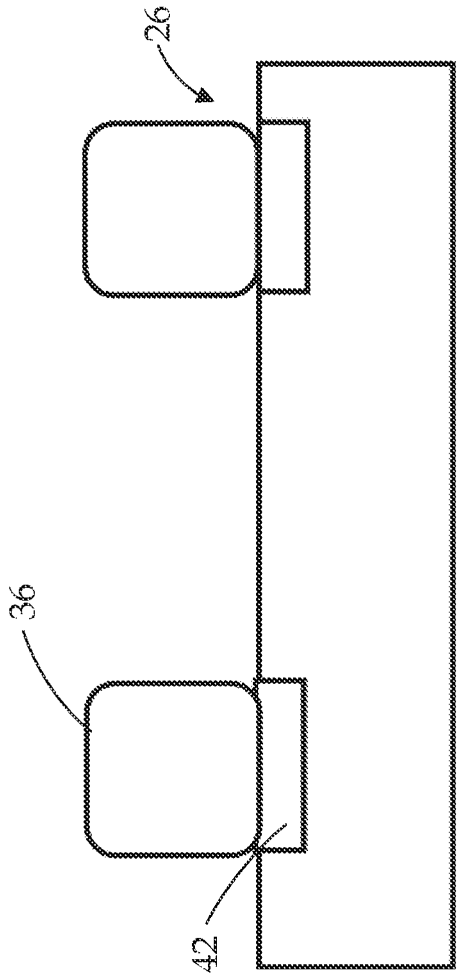
FIG. 4 shows a cross sectional view of a connector with conductive features, used in a processing system.

FIG. 4 shows a cross sectional view of a single component 26 attached to the first conductive feature 36. The first conductive feature 36 can be an ESD foam, a conductive foam, a conductive glue, or any other suitable conductive material. As an example, the first conductive feature 36 may include an ESD foam that includes conductive material over a foam gasket. As described herein, the component 26 may be a PCB. The component 26 may have a soldering mask on its surface to protect underlying circuitry and/or metal structures. The soldering mask may be removed in limited areas to expose the underlying metal connections. The exposed metal connection area 42 can electrically connect the component 26 to other components of the processing system 10. For example, the metal connection area 42 may be electrically connected to a conductive structure of the cooling system 18 by way of a conductive feature, such as the first conductive feature 36. There may be one or more exposed metal connection areas 42. For example, there may be 1, 2, 3, or 4 exposed metal connection areas 42 for a given connector 26. In some implementations, the conductive feature attached to the component 26 may be made of any suitable conductive material. The component 26 may also provide ground to a SoW by way of contacts, such as copper pillars, on a surface of the SoW that are electrically connected to the component 26.

In certain embodiments, a conductive structure of a thermal system may be at a ground potential and electrically connected to contact on a surface of a SoW by way of a plurality of conductive features. The conductive features can be positioned around a periphery of the SoW. In certain applications, the conductive features can extend from contacts on a surface of a SoW. Example conductive features and electrical connections between contacts, such as UBM pads, and the conductive structure of the thermal system, such as a conductive structure of the cooling system 18 will be described with reference to FIGS. 5A to 5C. A processing system and/or SoW assembly may include a first set of conductive features in accordance with any suitable the principles and advantages discussed with reference to FIG. 4 and a second set of conductive features in accordance with any suitable the principles and advantages discussed with reference to any of FIGS. 5A to 5C.

Figure 5A:
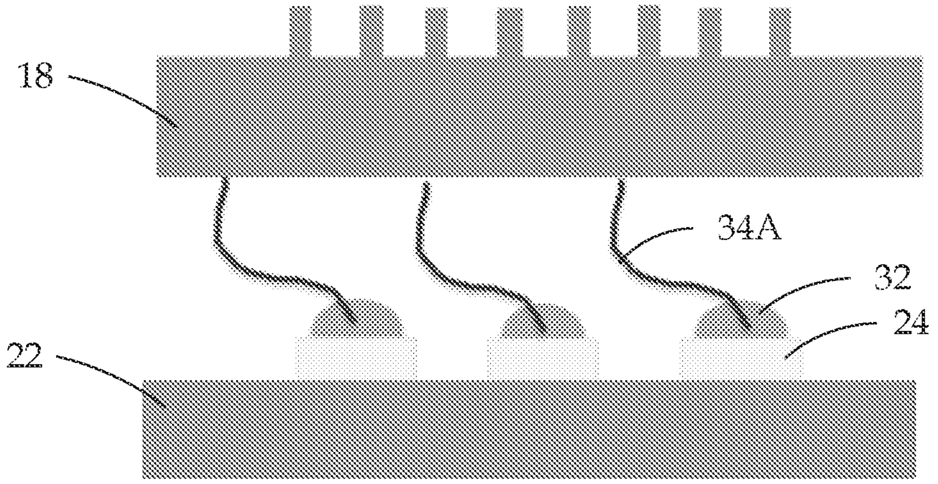
FIGS. 5A, 5B, and 5C show examples of conductive features which may be used in a processing system.
Figure 5B:
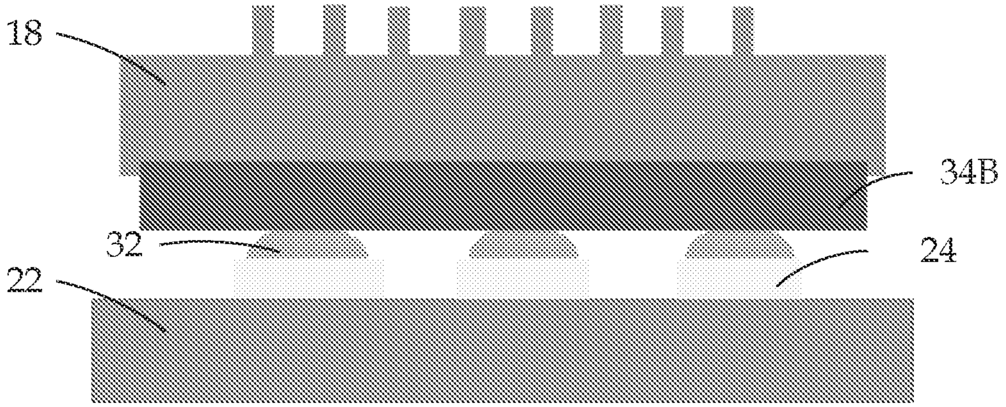
Figure 5C:
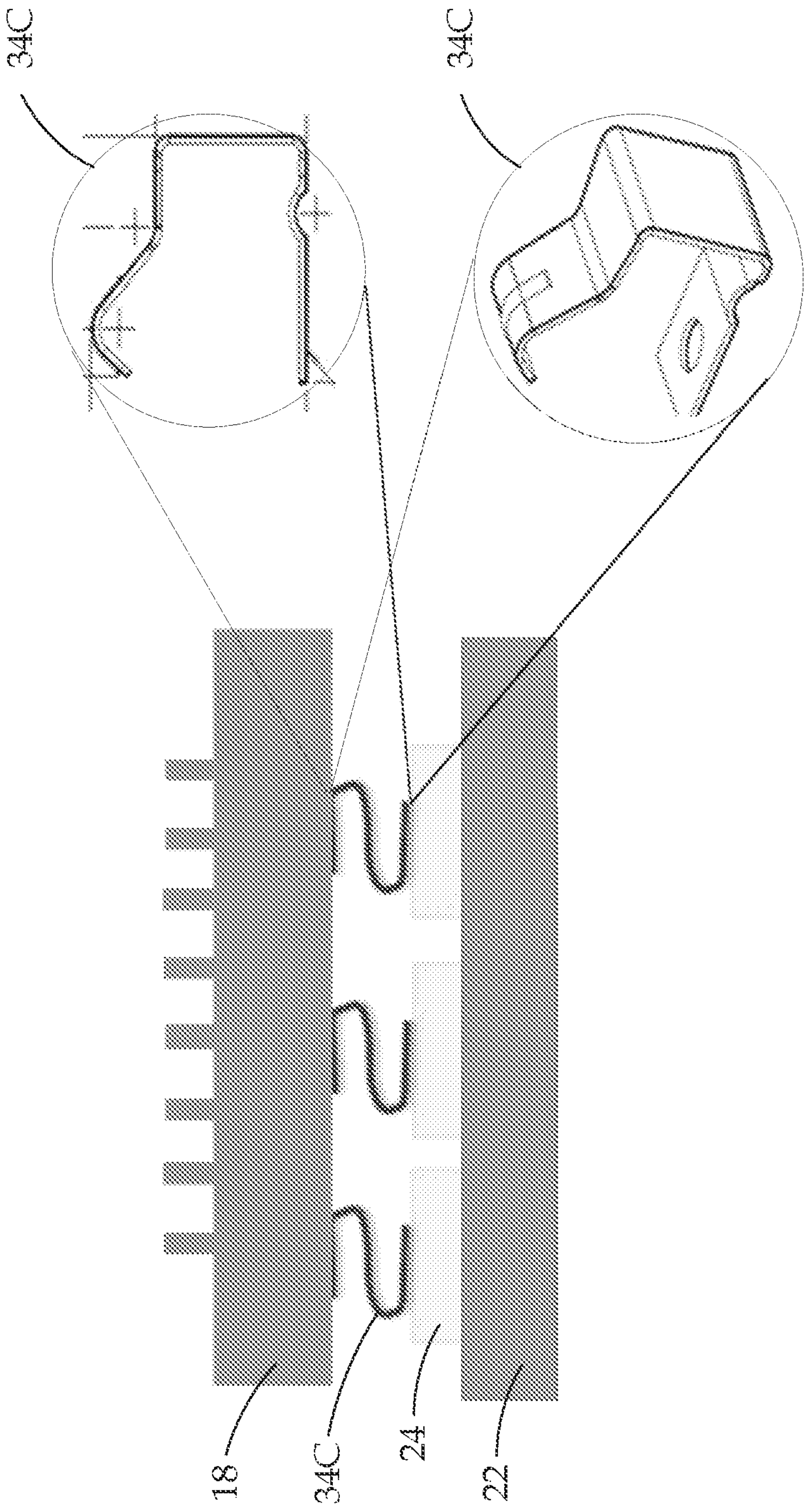

FIGS. 5A to 5C illustrate example conductive features 34 that may be used to connect the open-air UBM pads to the cooling system 18. FIGS. 5A to 5C show electrical connections between the SoW 14, electrical contacts 24, conductive feature 34, and cooling system 18. FIG. 5A depicts a wire 34A as a conductive feature. One end of a wire 34A may be attached to an electrical contact 24 with solder 32 and the other end of the wire 34A may be attached to the cooling system 18. The wire 34A may be made of any suitable electrically conductive material. In some implementations, the wire 34A may be attached to the electrical contact 24 without the use of solder 32. The wire 34A may be referred to as a wire bond. Any suitable number or all of the electrical contacts 24 shown in FIG. 2 may be electrically connected to the cooling system 18 by way of a wire 34A.

FIG. 5B shows ESD foam 34B as a conductive feature. A layer of ESD foam 34B may be positioned between the electrical contacts 24 and the cooling system 18. The ESD foam 34B may be a conductive foam. As an example, the ESD foam 34B may include conductive material over a foam gasket. The ESD foam 34B may have a range of sizes. For example, in some implementations, the electrical contacts 24 may be connected to the cooling system 18 via one or a few slabs of ESD foam 34B to increase and/or maximize the cooling system 18 surface area in contact with ESD foam 34B. In some other implementations, the ESD foam 34B include smaller pieces such that each piece of ESD foam only covers the surface area of one electrical contact 24, and each electrical contact 24 is connected to one piece of ESD foam 34B. In some implementations, the ESD foam 34B may be attached to the electrical contact 24 with solder 32. In some other implementations, the ESD foam 34B may be in direct contact with the electrical contact 24. Any suitable number or all of the electrical contacts 24 shown in FIG. 2 may be electrically connected to the cooling system 18 by way of an ESD foam 34B. In certain applications, a conductive glue or other suitable conductive material can be implemented in place of ESD foam 34B.

FIG. 5C shows a spring-loaded conductive feature 34C, which can be a spring-loaded clip. The spring-loaded conductive feature 34C may be made of any suitable conductive material. The spring-loaded conductive feature 34C may contain a spring. In other implementations, the spring-loaded conductive feature 34C may be a semi-rigid component that returns to its original shape after distortion. FIG. 5C shows side and isometric views of an example semi-rigid spring-loaded conductive feature design. In some implementations, the spring-loaded conductive feature 34C may be attached to the electrical contact 24 with solder. In some other implementations, the spring-loaded conductive feature 34C may be placed in direct contact with the electrical contact 24. Any suitable number or all of the electrical contacts 24 shown in FIG. 2 may be electrically connected to the cooling system 18 by way of a spring-loaded conductive feature 34C. Each of the conductive features described herein may be used individually or in conjunction with one or more other types of conductive features.

Figure 6:
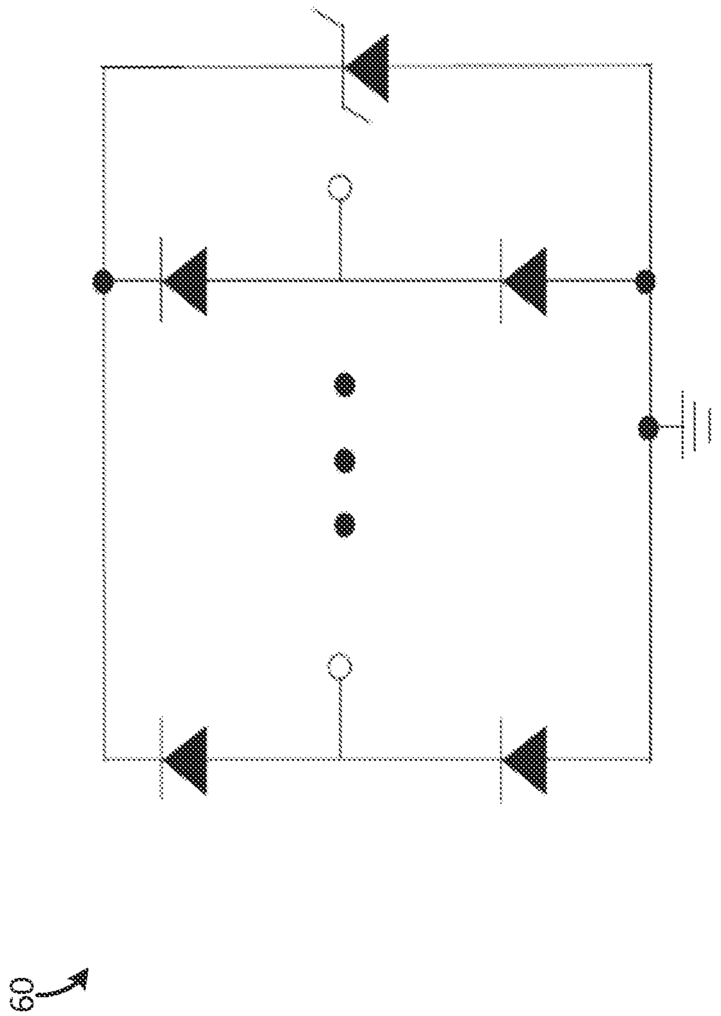
FIG. 6 is a schematic diagram of an example electrostatic discharge protection circuit.

In some applications, an ESD protection circuit may be included in the processing systems disclosed herein. For example, an ESD protection circuit may be implemented together with the components 26 grounded by electrical connections with a conductive structure of the cooling system 18 of FIGS. 3 and/or 4. An example ESD protection circuit 60 is shown in FIG. 6. The ESD protection circuit 60 may be on the component 26 (e.g., on a PCB when the component 26 is a PCB). The ESD protection circuit 60 may be on the SoW 14 in certain applications. The ESD protection circuit 60 may provide ESD protection for any of the processing systems and/or SoW assemblies disclosed herein.

In some implementations, a processing system with integrated ESD and/or EMI protection features may be manufactured by electrically connecting a SoW to a thermal system. The SoW may include a plurality of IC dies electrically connected to one or more routing layers in the SoW. The thermal system may include two parts, each of which may include an electrically conductive structure at a ground potential. The SoW may be positioned between the two parts of the thermal system. The SoW may be placed in contact with a first part of the thermal system such that the SoW is electrically connected to the first part of the thermal system.

Components for data transfer may be placed on a surface of the SoW, between the SoW and a second part of the thermal system, such that the components are electrically connected to the IC dies via the routing layers. Each component may have exposed conductive material on a surface opposite the SoW. Conductive features may be placed in contact with the exposed conductive material and the second part of the thermal system, electrically connecting each component with the second part of the thermal system.

Electrical contact areas may also be located on the surface of the SoW, such that the contact areas are electrically connected to the IC dies via the routing layers. Conductive features may be positioned between the second part of the thermal system and the contact areas such that the second part of the thermal system is electrically connected to the contact areas. The second part of the thermal system may thus be electrically connected to the IC dies via the components and contact areas. The first part of the thermal system and the second part of the thermal system may be secured to each other by a conductive frame.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein may be modified or otherwise implemented in various other ways without departing from the spirit and scope of the disclosure. Accordingly, this description is to be considered as illustrative and is for the purpose of teaching those skilled in the art the manner of making and using various embodiments of the disclosed IC assembly. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures may also be implemented in a more separated or integrated manner, or even removed or rendered as inoperable in certain cases, as is useful in accordance with a particular application. Additionally, any signal hatches in the drawings/figures should be considered only as exemplary, and not limiting, unless otherwise specifically specified.

What is claimed is:

1. A system on a wafer (SoW) assembly, the SoW assembly comprising:

- a SoW comprising a plurality of integrated circuit (IC) dies and one or more routing layers providing electrical connections for the IC dies;
- a thermal system comprising a conductive structure at a ground potential, the thermal system configured to cool the SoW; and
- a plurality of conductive features in electrical paths between contacts on a surface of the SoW and the conductive structure of the thermal system, the plurality of conductive features forming a structure with the thermal system that functions as a Faraday cage to provide electromagnetic interference shielding.

2. The SoW assembly of claim 1, wherein the plurality of conductive features ground the SoW to the conductive structure of the thermal system to provide electrostatic discharge protection.

3. The SoW assembly of claim 1, further comprising a plurality of components in electrical paths between the contacts on the surface of the SoW and the plurality of conductive features, wherein the plurality of components each have exposed conductive material in electrical paths with the conductive features.

4. The SoW assembly of claim 1, wherein the plurality of conductive features are positioned around a periphery of the SoW.

5. The SoW assembly of claim 1, wherein the plurality of conductive features comprise a conductive foam.

6. The SoW assembly of claim 1, wherein the plurality of conductive features comprise a wire bond.

7. The SoW assembly of claim 1, wherein the plurality of conductive features comprise a spring loaded clip.

8. The SoW assembly of claim 1, wherein the SoW is an Integrated Fan-Out wafer.

9. The SoW assembly of claim 1, further comprising voltage regulating modules positioned between the IC dies and the conductive structure of the thermal system.

10. The SoW assembly of claim 1, wherein the thermal system further comprises a thermal dissipation structure on an opposing side of the SoW relative to the conductive structure, and there is an electrical connection between the thermal dissipation structure and the conductive structure.

11. The SoW assembly of claim 1, wherein the SoW has a diameter of at least 12 inches.

12. The SoW assembly of claim 11, wherein the plurality of conductive features provide electromagnetic interference shielding.

13. A system on a wafer (SoW) assembly, the SoW assembly comprising:

a SoW comprising a plurality of integrated circuit (IC) dies and one or more routing layers providing electrical connections for the IC dies;

a thermal system comprising a conductive structure at a ground potential, the thermal system configured to cool the SoW;

a plurality of components positioned between the SoW and the conductive structure of the thermal system, wherein the components each have exposed conductive material on a surface opposite the SoW, wherein the plurality of components are electrically connected to the SoW by way of contacts on a surface of the SoW; and a plurality of conductive features in electrical paths between the exposed conductive material of the plurality of components and the conductive structure of the thermal system.

14. The SoW assembly of claim 13, wherein the plurality of components comprise a printed circuit board.

15. The SoW assembly of claim 14, further comprising an electrostatic discharge protection circuit on the printed circuit board.

16. The SoW assembly of claim 13, wherein the plurality of conductive features contribute to electrostatic discharge protection.

17. The SoW assembly of claim 13, wherein the plurality of conductive features comprise a conductive foam.

18. The SoW assembly of claim 13, wherein the plurality of components are positioned around the plurality of IC dies.

19. A method of manufacturing a system on a wafer (SoW) assembly, the method comprising:

providing a SoW with contacts on a surface of the SoW, wherein the SoW comprises a plurality of integrated circuit (IC) dies and one or more routing layers providing electrical connections for the IC dies, and wherein the contacts are electrically connected to the IC dies via the one or more routing layers; and electrically connecting a conductive structure of a thermal system to the contacts on the surface of the SoW by way of at least a plurality of conductive features, wherein the conductive structure of the thermal system is at a ground potential, the plurality of conductive features forming a structure with the thermal system that functions as a Faraday cage to provide electromagnetic interference shielding.

20. The method of claim 19, wherein the electrically connecting provides electrical connections between the conductive structure and the contacts by way of components on the contacts.

21. The method of claim 19, wherein the thermal system comprises a second part on an opposing side of the SoW relative to the conductive structure, and the method further comprises securing the first part of the thermal system and the second part of the thermal system to each other via a conductive frame.

22. A system on a wafer (SoW) assembly, the SoW assembly comprising:

a SoW comprising a plurality of integrated circuit (IC) dies and one or more routing layers providing electrical connections for the IC dies;

a thermal system comprising a conductive structure at a ground potential, the thermal system configured to cool the SoW;

a plurality of conductive features in electrical paths between contacts on a surface of the SoW and the conductive structure of the thermal system; and a plurality of components in electrical paths between the contacts on the surface of the SoW and the plurality of conductive features, wherein the plurality of components each have exposed conductive material in electrical paths with the conductive features.

* * * * *